(12) United States Patent
Fu

(10) Patent No.: US 10,729,017 B2
(45) Date of Patent: Jul. 28, 2020

(54) CIRCUIT BOARD AND METHOD OF MAKING SAME

(71) Applicants: HongQiSheng Precision Electronics (QinHuangDao) Co.,Ltd., Qinghuangdao (CN); Avary Holding (Shenzhen) Co., Limited., Shenzhen (CN)

(72) Inventor: Chih-Chieh Fu, New Taipei (TW)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/253,517

(22) Filed: Jan. 22, 2019

(65) Prior Publication Data

US 2020/0113065 A1 Apr. 9, 2020

(30) Foreign Application Priority Data

Oct. 8, 2018 (CN) .......................... 2018 1 1169327

(51) Int. Cl.
| | |
|---|---|
| H05K 1/14 | (2006.01) |
| H05K 3/40 | (2006.01) |
| H05K 3/32 | (2006.01) |
| H05K 1/11 | (2006.01) |
| H05K 1/16 | (2006.01) |
| H05K 1/02 | (2006.01) |

(52) U.S. Cl.
CPC ........... *H05K 3/4038* (2013.01); *H05K 1/115* (2013.01); *H05K 1/165* (2013.01); *H05K 3/32* (2013.01); *H05K 1/0298* (2013.01)

(58) Field of Classification Search
CPC ...... H05K 3/4038; H05K 1/115; H05K 1/165; H05K 3/32; H05K 1/0298
USPC ........................................................ 174/261
See application file for complete search history.

(56) References Cited

U.S. PATENT DOCUMENTS

| | | | | |
|---|---|---|---|---|
| 5,275,330 A | * | 1/1994 | Isaacs .................. | B23K 1/0016 228/180.21 |
| 2015/0034377 A1 | * | 2/2015 | Min ..................... | H05K 3/0029 174/264 |

* cited by examiner

*Primary Examiner* — Tremesha S Willis
(74) *Attorney, Agent, or Firm* — ScienBiziP, P.C.

(57) ABSTRACT

A circuit board includes a substrate and at least two through holes defined in the substrate. The substrate includes a first conductive circuit layer and a second conductive circuit layer. The first conductive circuit layer and the second conductive circuit layer are respectively formed on opposite surfaces of the substrate. A number of conductive strips are formed on an inner wall of each of the at least two through holes. The number of conductive strips on the inner wall of a first one of the at least two through holes faces the number of conductive strips on the inner wall of a second one of the at least one through hole.

10 Claims, 8 Drawing Sheets

CIRCUIT BOARD AND METHOD OF MAKING SAME

FIELD

The subject matter herein generally relates to circuit boards, and more particularly to a circuit board having an embedded inductive component.

BACKGROUND

As electronic devices become smaller, circuit boards of the electronic devices are required to be smaller. Thus, a surface area of the circuit board needs to become smaller for mounting circuit components.

BRIEF DESCRIPTION OF THE DRAWINGS

Implementations of the present disclosure will now be described, by way of embodiments, with reference to the attached figures.

DETAILED DESCRIPTION

Figure 1:
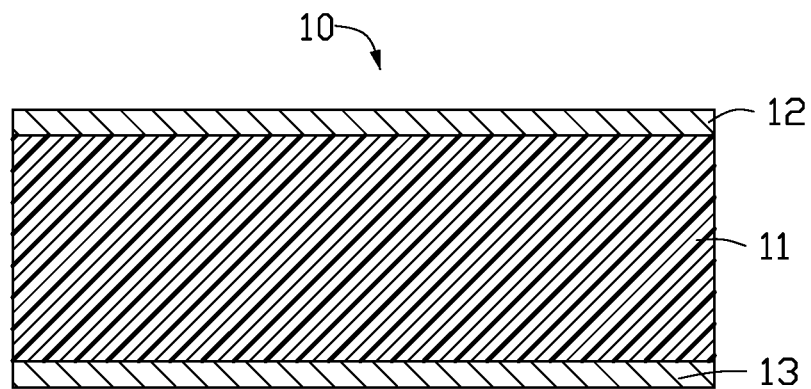
FIG. 1 is a cross-sectional view of a first embodiment of a substrate of a circuit board.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 2:
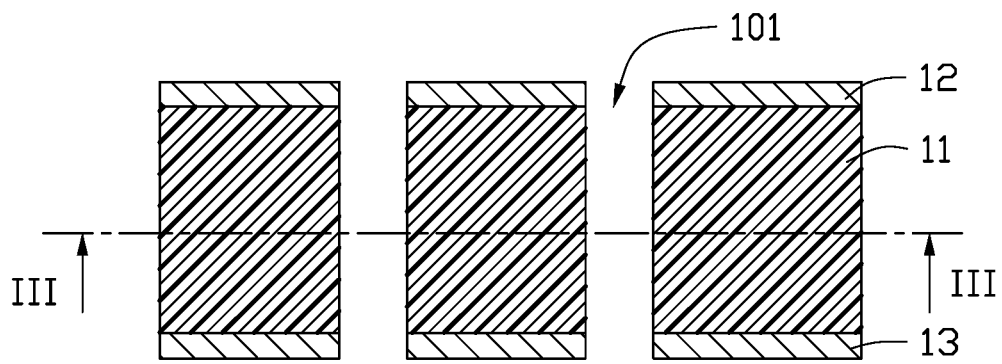
FIG. 2 shows the substrate in FIG. 1 with at least two through holes defined therein.

FIGS. 1-2 show a first embodiment of a method of making a circuit board 100.

As shown in FIG. 1, a substrate 10 is provided. The substrate 10 includes a base layer 11, a first conductive material layer 12, and a second conductive material layer 13. The first conductive material layer 12 and the second conductive material layer 13 are formed on opposite sides of the base layer 11. The first conductive material layer 12 and the second conductive material layer 13 can be made of the same material or different materials. The substrate 10 can be a multi-layer circuit board and include at least one circuit layer.

In one embodiment, the base layer 11 is made of flexible material, such as polyimide, polyethylene naphthalate, or polyethylene terephthalate. In one embodiment, the first conductive material layer 12 and the second conductive material layer 13 is made of copper. In other embodiments, the first conductive material layer 12 and the second conductive material layer 13 are made of other conductive material, such as elemental metal, metal-alloy, metal-oxide, or the like.

Figure 3:
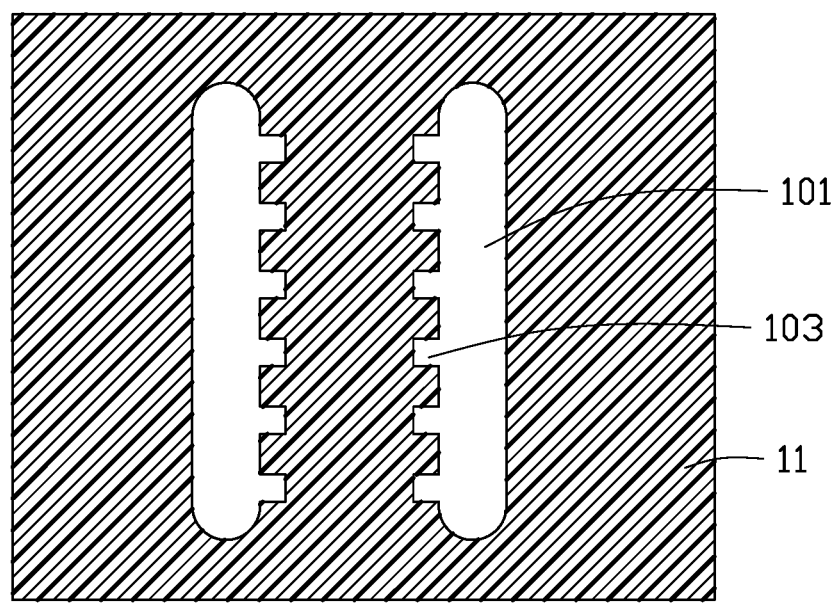
FIG. 3 is a top view of the substrate in FIG. 2 showing a plurality of via slots defined in the through holes.

As shown in FIGS. 2-3, the substrate 10 defines at least two through holes 101 passing through the first conductive material layer 12, the base layer 11, and the second conductive material layer 13. In one embodiment, the at least two through holes 101 are aligned along a same direction and are adjacent to each other but not electrically coupled together. In another embodiment, a quantity of the through holes 101 is four. The four through holes 101 are aligned along a same direction and are adjacent to each other. A shape of the through holes 101 may be rectangular.

In one embodiment, the through holes 101 are formed by laser processing. In another embodiment, the through holes 101 are formed by a high-pressure water jet, air knife cutting, lathe or machine cutting, chemical etching, physical etching, or other method.

Figure 4:
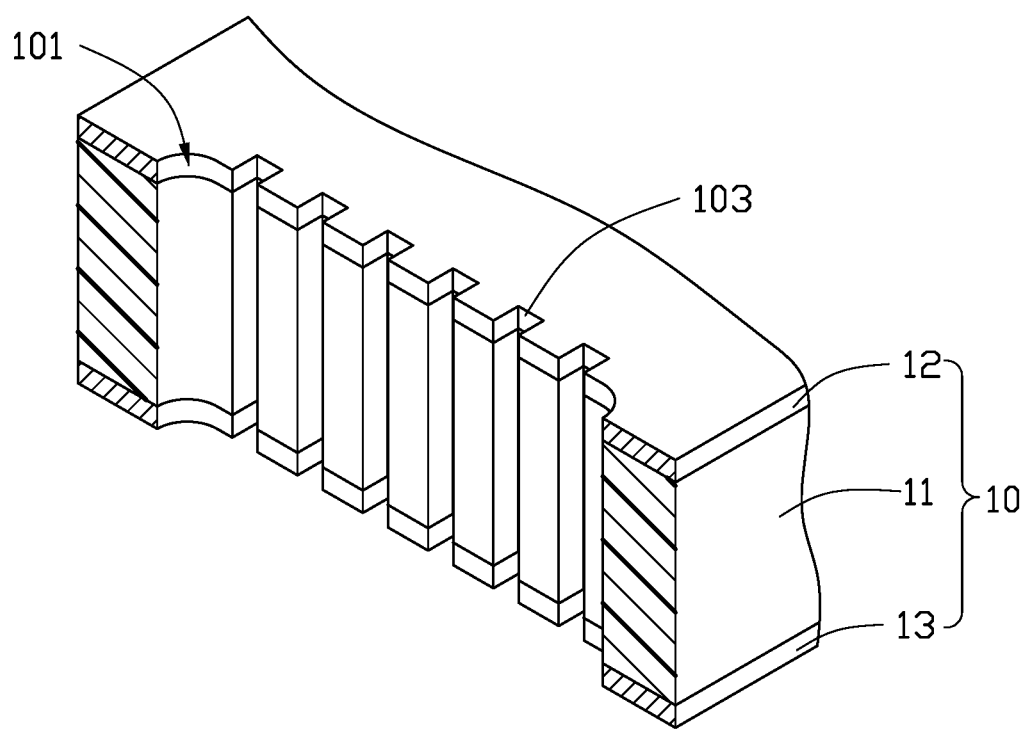
FIG. 4 is a cutaway view of the substrate in FIG. 3.

As shown in FIGS. 3-4, a plurality of via slots 103 are defined in an inner wall of each through hole 101. Each of the plurality of via slots 103 passes through the first conductive material layer 12, the base layer 11, and the second conductive material layer 13. The via slots 103 are defined in adjacent sidewalls of two adjacent through holes 101. In one embodiment, a quantity of the plurality of via slots 103 of each through hole 101 is six. The plurality of via slots 103 are parallel and rectangular. In other embodiments, the plurality of via slots 103 can intersect each other, and a quantity and distribution of the via slots 103 can be changed according to requirements.

In one embodiment, the via slots 103 are formed by laser processing. In another embodiment, the via slots 103 are formed by a high-pressure water jet, air knife cutting, lathe or machine cutting, chemical etching, physical etching, or other method.

Figure 5:
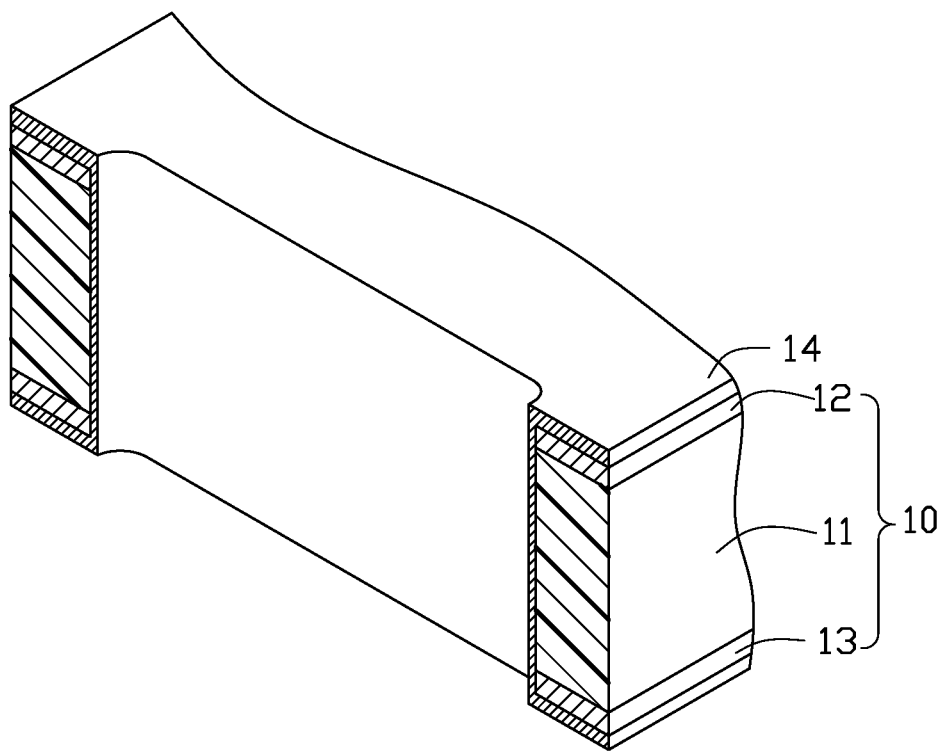
FIG. 5 shows the through holes in FIG. 4 being metalized.

As shown in FIGS. 4 and 5, the through holes 101 and the via slots 103 are filled with a third conductive material layer 14. The third conductive material layer 14 fills in each of the via slots 103 and covers the inner wall of the through holes 101 and a portion of the first conductive material layer 12 and the second conductive material layer 13.

In one embodiment, the third conductive material layer 14 is made of metal. In other embodiments, the third conductive material layer 14 can be made of other conductive materials, such as elemental metal, metal-alloy, or metal-oxide.

Figure 6:
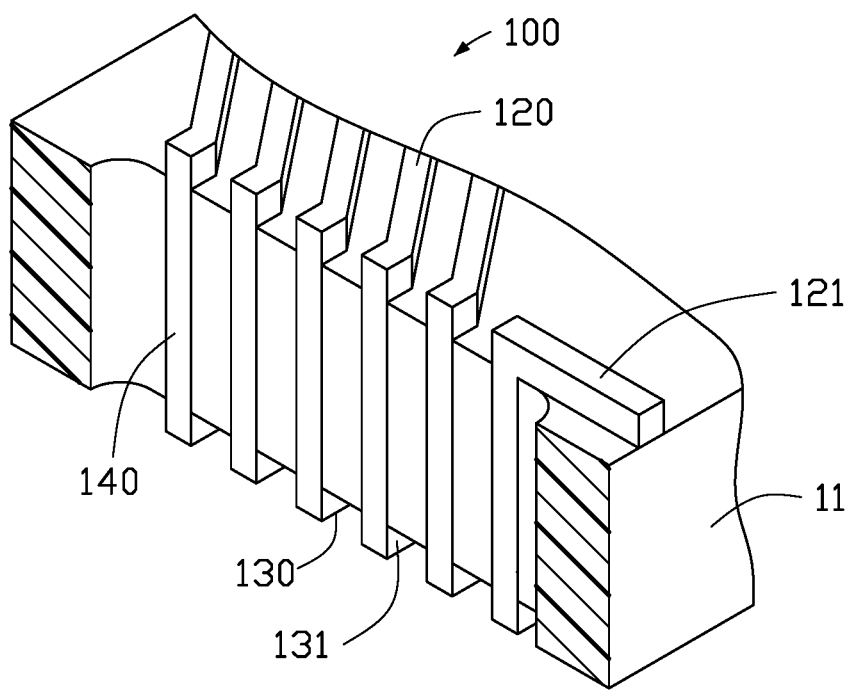
FIG. 6 shows the through holes in FIG. 5 after a third conductive material layer is removed from the through holes.

As shown in FIGS. 5 and 6, the first conductive material layer 12, the second conductive material layer 13, and the third conductive material layer 14 are processed to form a first conductive circuit layer 120, a second conductive circuit layer 130, and a plurality of conductive strips 140. The first conductive circuit layer 120, the second conductive circuit layer 130, and the third conductive material layer 14 constitute a conductive layer. The first conductive circuit layer 120 includes a plurality of first conductive circuit lines 121, and the second conductive circuit layer 130 includes a plurality of second conductive circuit lines 131. One end of each of the plurality of conductive strips 140 is electrically coupled to one of the plurality of first conductive circuit lines 121, and another end of each of the plurality of conductive strips 140 is electrically coupled to one of the plurality of second conductive circuit lines 131. Thus, each conductive strip 140 electrically couples one of the plurality of first conductive circuit lines 121 to a corresponding one of the plurality of second conductive circuit lines 131. Each of the plurality of conductive strips 140 of one through hole 101 is electrically coupled through a corresponding one of the plurality of first conductive circuit lines 121 and a corresponding one of the plurality of second conductive circuit lines 131 to a corresponding one of the plurality of conductive strips 140 of an adjacent through hole 101.

The third conductive material layer 14 can be removed from the inner wall of the through hole 101 by a machine drilling process. In other embodiments, the third conductive material layer 14 can be removed by laser cutting, a high-pressure water jet, air knife cutting, lathe or machine cutting, chemical etching, physical etching, or other method.

FIGS. 7-12 show a second embodiment of a method for making a circuit board 100.

Figure 7:
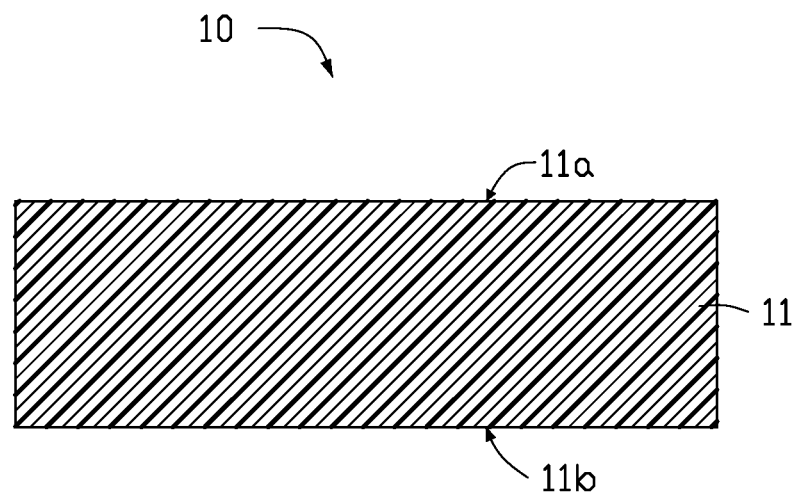
FIG. 7 is a cross-sectional view of a second embodiment of a substrate of a circuit board.

As shown in FIG. 7, a substrate 10 is provided. The substrate 10 includes a base layer 11. The base layer 11 includes opposite surfaces 11a and 11b. The substrate 10 can be a multi-layer circuit board and include at least one circuit layer.

In one embodiment, the base layer 11 is made of flexible material, such as polyimide, polyethylene naphthalate, or polyethylene terephthalate.

Figure 8:
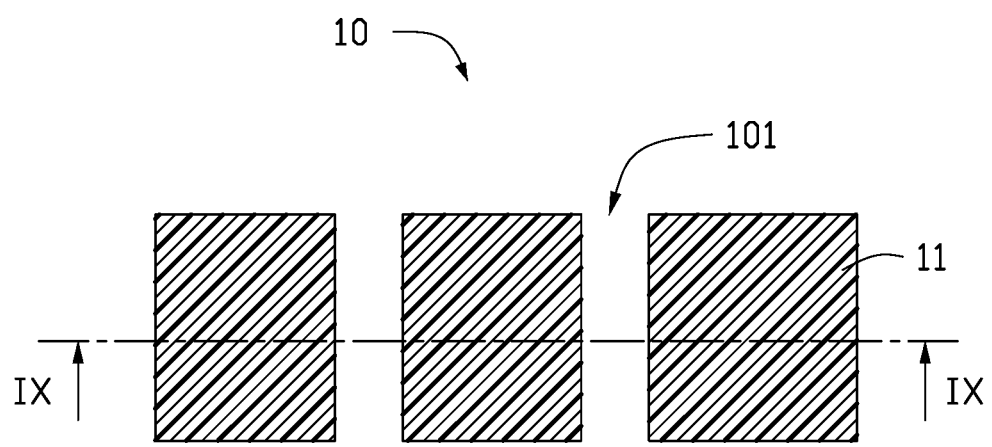
FIG. 8 shows the substrate in FIG. 7 with at least two through holes defined therein.
Figure 9:
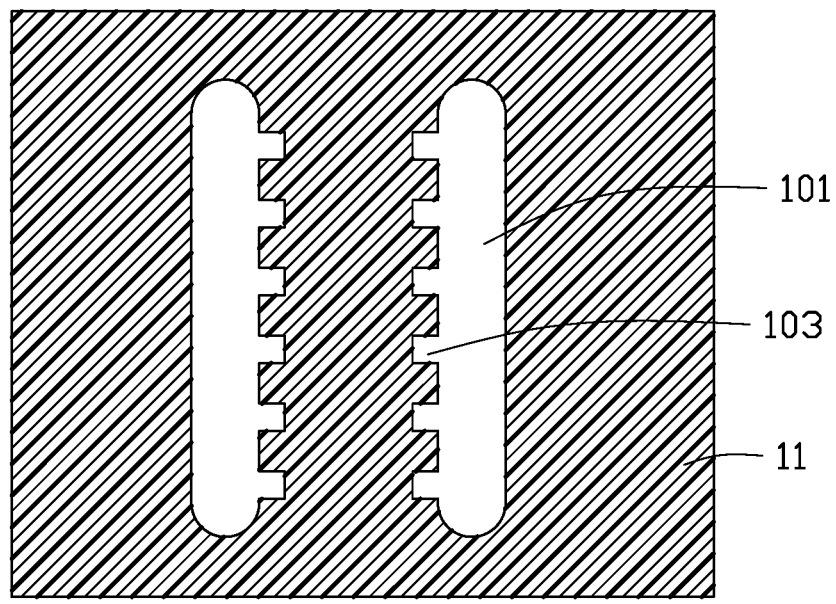
FIG. 9 is a top view of the substrate in FIG. 8 showing a plurality of via slots defined in the through holes.

As shown in FIGS. 8 and 9, at least two through holes 101 are defined through the base layer 11. In one embodiment, the at least two through holes 101 are aligned along a same direction and are adjacent to each other but not electrically coupled together. In another embodiment, a quantity of the through holes 101 is four. The four through holes 101 are aligned along a same direction and are adjacent to each other. A shape of the through holes 101 may be rectangular.

In one embodiment, the through holes 101 are formed by laser processing. In another embodiment, the through holes 101 are formed by a high-pressure water jet, air knife cutting, lathe or machine cutting, chemical etching, physical etching, or other method.

Figure 10:
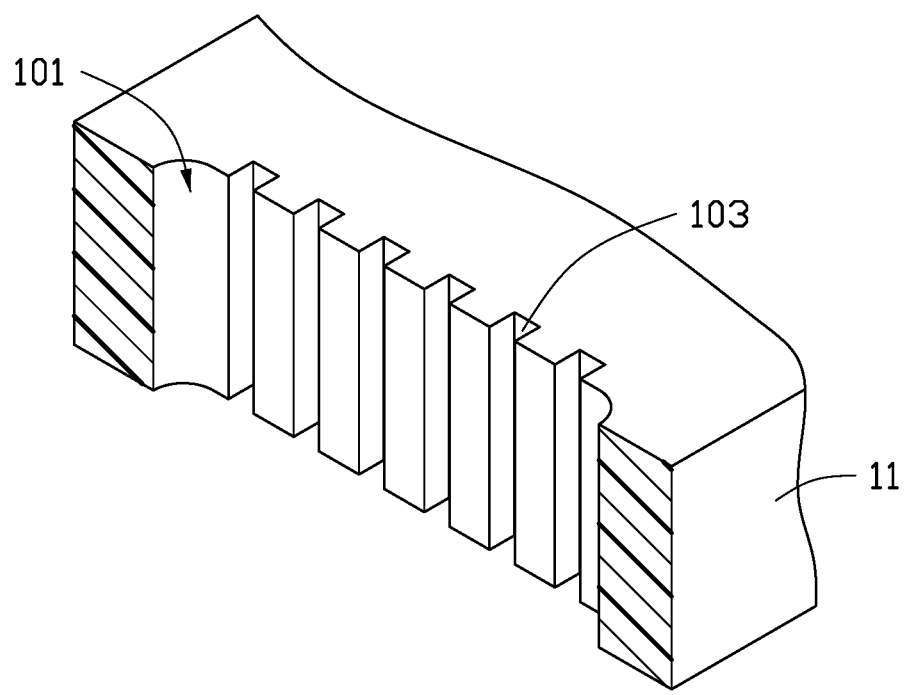
FIG. 10 is a cutaway view of the substrate in FIG. 9.

As shown in FIGS. 9 and 10, a plurality of via slots 103 are defined in an inner wall of each through hole 101. Each of the plurality of via slots 103 passes through the base layer 11. The via slots 103 are defined in adjacent sidewalls of two adjacent through holes 101. In one embodiment, a quantity of the plurality of via slots 103 of each through hole 101 is six. The plurality of via slots 103 are parallel and rectangular. In other embodiments, the plurality of via slots 103 can intersect each other, and a quantity and distribution of the via slots 103 can be changed according to requirements.

In one embodiment, the via slots 103 are formed by laser processing. In another embodiment, the via slots 103 are formed by a high-pressure water jet, air knife cutting, lathe or machine cutting, chemical etching, physical etching, or other method.

Figure 11:
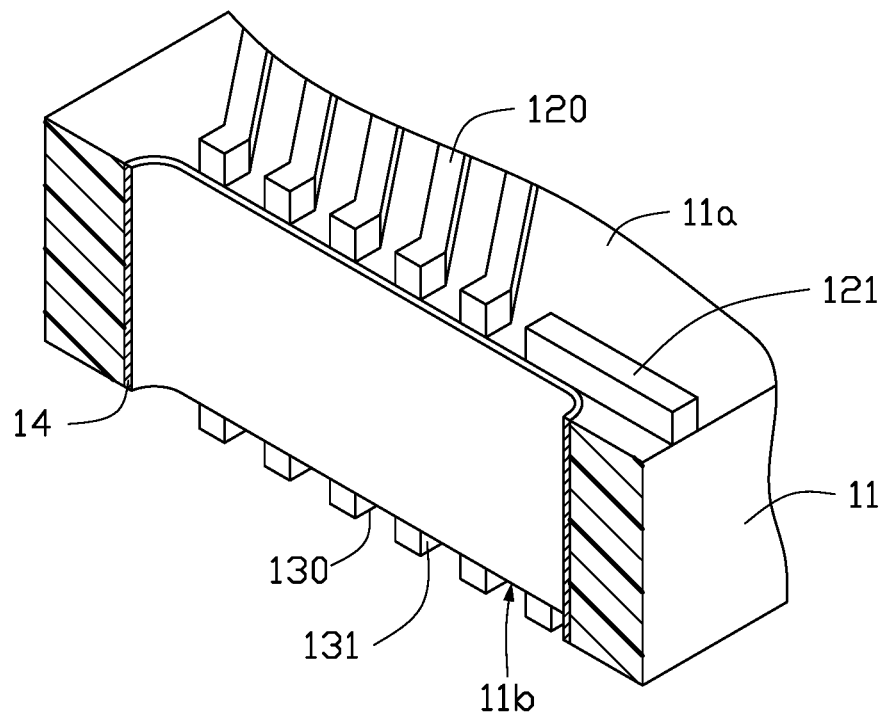
FIG. 11 shows the substrate in FIG. 10 having a first conductive circuit layer, a second conductive circuit layer, and a third conductive material layer.

As shown in FIGS. 10 and 11, a first conductive circuit layer 120 is formed on the surface 11a, a second conductive circuit layer 130 is formed on the surface 11b, and a third conductive material layer 14 is formed on the inner wall of the through holes 101. The first conductive circuit layer 120, the second conductive circuit layer 130, and the third conductive material layer 14 constitute a conductive layer. The first conductive circuit layer 120 includes a plurality of first conductive circuit lines 121, and the second conductive circuit layer 130 includes a plurality of second conductive circuit lines 131.

In one embodiment, the first conductive circuit layer 120, the second conductive circuit layer 130, and the third conductive material layer 14 are made of copper. In other embodiments, the first conductive circuit layer 120, the second conductive circuit layer 130, and the third conductive material layer 14 are made of other conductive material, such as elemental metal, metal-alloy, metal-oxide, or the like.

Figure 12:
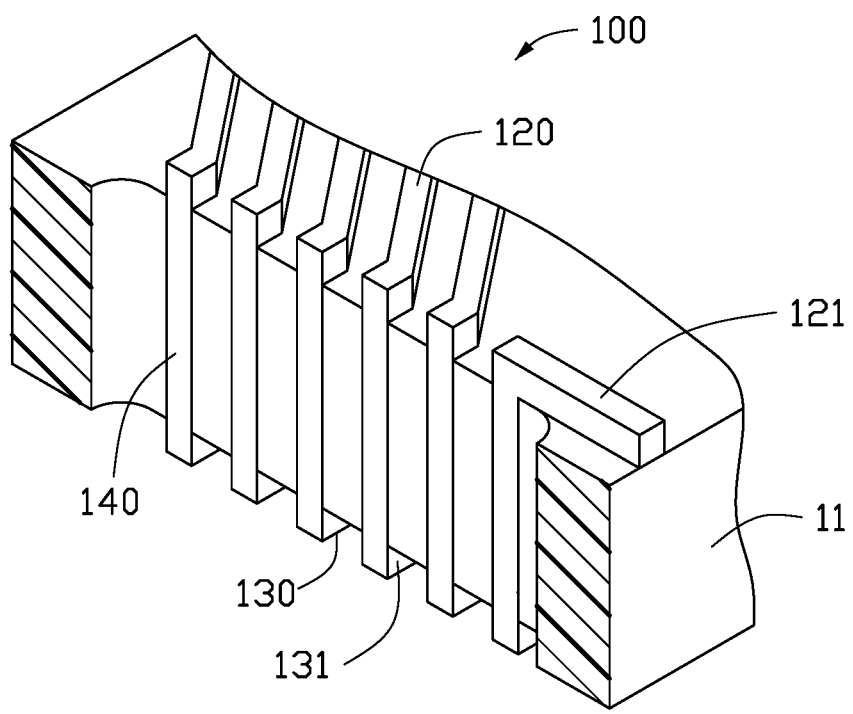
FIG. 12 shows the substrate in FIG. 11 having the third conductive material layer removed.

As shown in FIGS. 11 and 12, the third conductive material layer 14 can be removed from the inner wall of the through hole 101 by a machine drilling process, thereby forming a conductive strip 140 in each of the plurality of via slots 103. One end of each of the plurality of conductive strips 140 is electrically coupled to one of the plurality of first conductive circuit lines 121, and another end of each of the plurality of conductive strips 140 is electrically coupled to one of the plurality of second conductive circuit lines 131. Thus, each conductive strip 140 electrically couples one of the plurality of first conductive circuit lines 121 to a corresponding one of the plurality of second conductive circuit lines 131. Each of the plurality of conductive strips 140 of one through hole 101 is electrically coupled through a corresponding one of the plurality of first conductive circuit lines 121 and a corresponding one of the plurality of second conductive circuit lines 131 to a corresponding one of the plurality of conductive strips 140 of an adjacent through hole 101.

In other embodiments, the third conductive material layer 14 can be removed by laser cutting, a high-pressure water jet, air knife cutting, lathe or machine cutting, chemical etching, physical etching, or other method.

Figure 13:
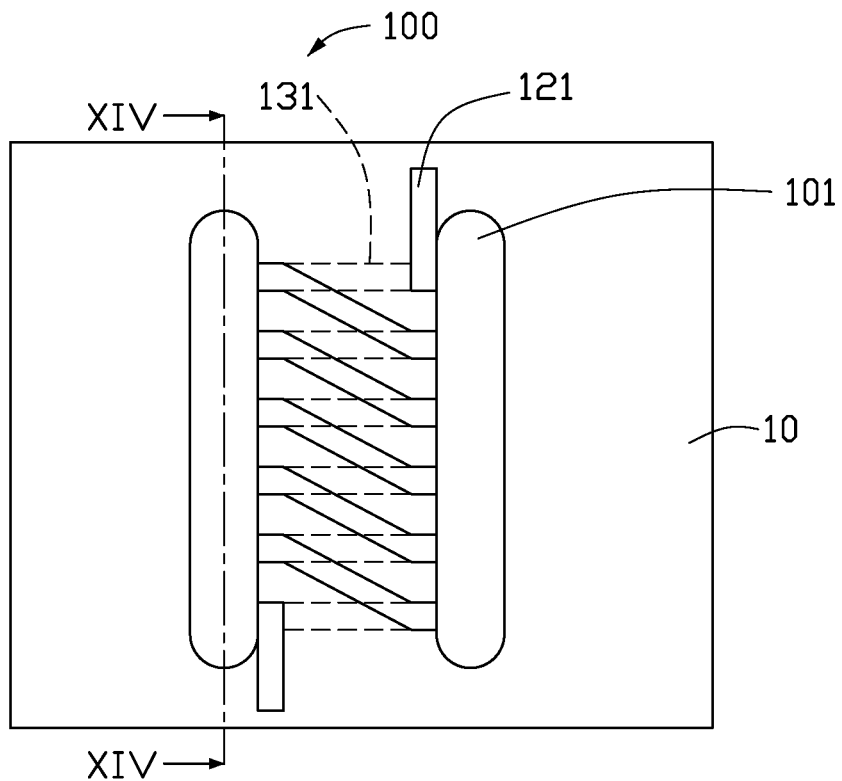
FIG. 13 is a top view of the substrate in FIG. 12.
Figure 14:
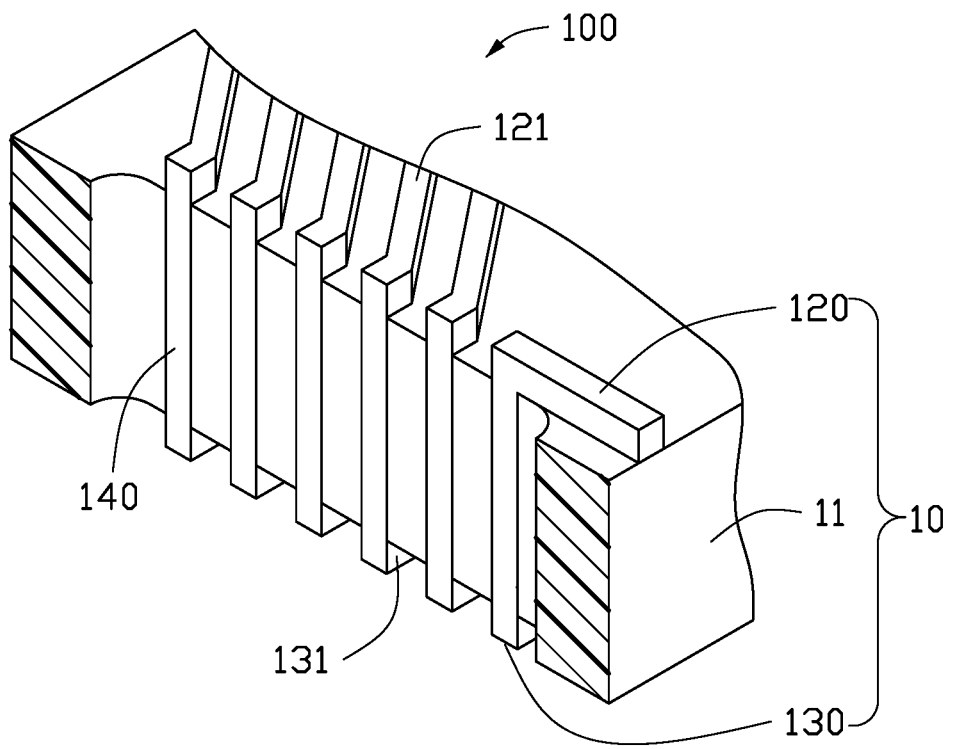
FIG. 14 shows the substrate in FIG. 13 taken along line XIV-XIV.
Figure 15:
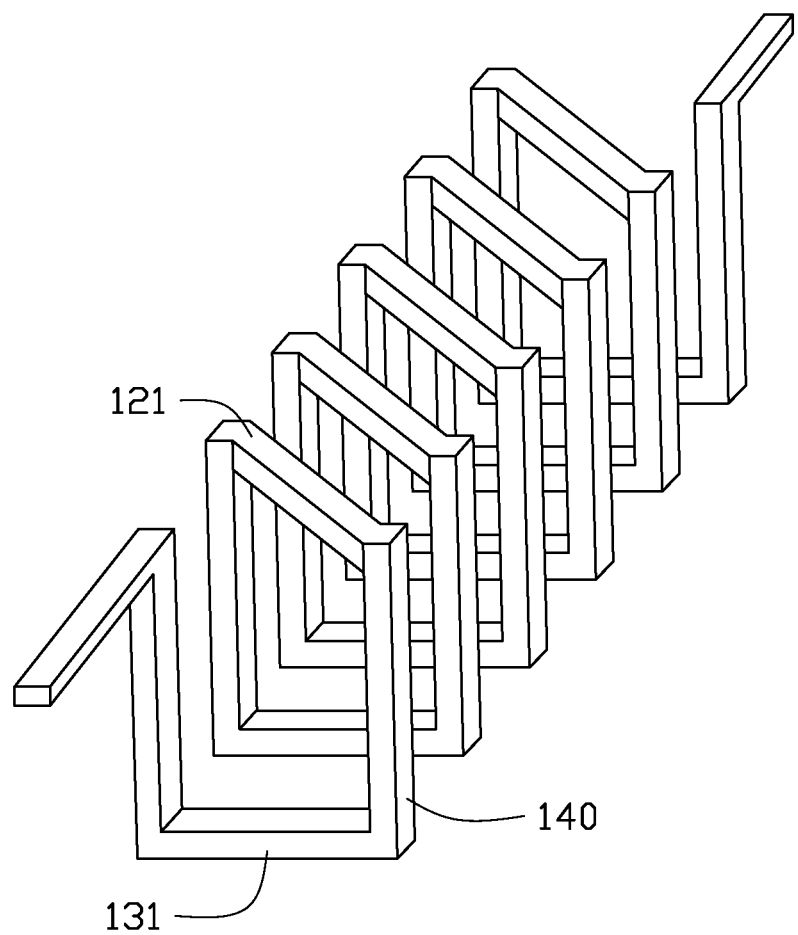
FIG. 15 is an isometric view of an inductive component formed by a plurality of first conductive circuit lines, a plurality of conductive strips, and a plurality of second conductive circuit lines.

FIGS. 13-15 show a circuit board 100 formed by the method of the first embodiment or the second embodiment.

As shown in FIG. 13, the circuit board 100 defines at least two through holes 101 through the substrate 10. A first conductive circuit line 121 is formed on a first surface of the circuit board 100, and a second conductive circuit line 131 is formed on a second surface of the circuit board 100 opposite to the first surface. In one embodiment, the first conductive circuit lines 121 and the second conductive circuit lines 131 are formed between adjacent two through holes 101.

As shown in FIG. 14, the substrate 10 includes a base layer 11, a first conductive circuit layer 120 formed on the first surface of the circuit board 100, and a second conductive circuit layer 130 formed on the second surface of the circuit board 100. A plurality of conductive strips 140 are formed on an inner wall of each of the through holes 101. Each of the conductive strips 140 electrically connects at least one of the first conductive circuit lines 121 to a corresponding one of the second conductive circuit lines 131. The first conductive circuit lines 121 are formed within the first conductive circuit layer 120, and the second conductive circuit lines 131 are formed within the second conductive circuit layer 130. The substrate 10 can be a multi-layer circuit board and include at least one circuit layer having a predetermine circuit pattern. The at least one circuit layer can be electrically coupled to the plurality of conductive strips 140 or insulated from the plurality of conductive strips 140.

As shown in FIG. 13, the conductive strips 140 are formed in adjacent sidewalls of two adjacent through holes 101. The conductive strips 140 located in the same through hole 101 are not in contact with each other, and each of the plurality of conductive strips 140 of one through hole 101 is electrically coupled through a corresponding one of the plurality of first conductive circuit lines 121 and a corresponding one of the plurality of second conductive circuit lines 131 to a corresponding one of the plurality of conductive strips 140 of an adjacent through hole 101.

As shown in FIG. 15, the first conductive circuit lines 121, the conductive strips 140, and the second conductive circuit lines 131 are coupled together in sequence as one piece to form an inductive component.

In one embodiment, the at least two through holes 101 are aligned along a same direction adjacent to each other and do not contact each other. The at least two through holes 101 are rectangular. In another embodiment, a quantity of the through holes 101 is four. The four through holes 101 are aligned along a same direction adjacent to each other. The first conductive circuit lines 121, the conductive strips 140, and the second conductive circuit lines 131 are coupled together in sequence as one piece to wrap around adjacent inner walls of the adjacent two through holes 101 to form an inductive component. Thus, the inductive component is embedded in the circuit board 100, and an external inductive component is not required to be mounted to the circuit board 100, thereby saving space and reducing a cost of production.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A method of making a circuit board, the method comprising: providing a substrate comprising a first surface and a second surface opposite to the first surface; defining at least one through hole through the substrate to pass through the first surface and the second surface; defining a plurality of via slots in an inner wall of the at least one through hole, each of the plurality of via slots passing through the first surface and the second surface through the substrate; forming a conductive circuit layer on the substrate, wherein the conductive circuit layer comprises a first conductive circuit layer covering the first surface, a second conductive circuit layer covering the second surface, and a third conductive circuit material layer, the third conductive circuit material layer covers the inner wall of the at least one through hole and fills in each of the plurality of via slots; and removing a part portion of the third conductive circuit material layer which is covering the inner wall of the at least one through hole to form a conductive strip in each of the plurality of via slots, wherein each of the conductive strips is electrically coupled to the first conductive circuit layer and the second conductive circuit layer.

2. The method of claim 1, wherein:
a first conductive circuit material layer is formed on the first surface of the substrate;
a second conductive circuit material layer is formed on the second surface of the substrate;
the first conductive circuit layer is formed from the first conductive circuit material layer, and the second conductive circuit layer is formed from the second conductive circuit material layer.

3. The method of claim 1, wherein the conductive circuit layer is formed by a fully-additive process.

4. The method of claim 3, wherein the plurality of conductive strips are formed by at least one of machine drilling, laser cutting, or etching the part portion of the third conductive circuit material layer on the inner wall of the through hole.

5. The method of claim 1, wherein:
the substrate defines at least two through holes; and
the plurality of via slots defined on a side of a first one of the at least two through holes facing the plurality of via slots defined on a side of a second one of the at least two through holes.

6. A circuit board comprising: a substrate comprising a first conductive circuit layer and a second conductive circuit layer, wherein the first conductive circuit layer and the second conductive circuit layer are respectively formed on opposite surfaces of the substrate; at least two through holes defined through the substrate to pass through the opposite surfaces of the substrate: a plurality of via slots defined in an inner wall of the at least two through holes, each of the plurality of via slots passing through the first surface and the second surface through the substrate; conductive strips being formed in each of the plurality of via slots; and wherein the conductive strips on the inner wall of a first one of the at least two through holes face the conductive strips on the inner wall of a second one of the at least two through holes; and each of the conductive strips is electrically coupled to the first conductive circuit layer and the second conductive circuit layer.

7. The circuit board of claim 6 further comprising at least one circuit layer comprising at least one conductive circuit line.

8. The circuit board of claim 6 comprising a plurality of through holes defined through the substrate.

9. The circuit board of claim 6, wherein:
the first conductive circuit layer comprises at least one first conductive circuit line;
the second conductive circuit layer comprises at least one second conductive circuit line; and
the at least one first conductive circuit line, the plurality of conductive strips, and the at least one second conductive circuit line are electrically coupled and form an inductive component.

10. The circuit board of claim 7, wherein the at least one circuit layer is electrically coupled to the plurality of conductive strips.

* * * * *